United States Patent
Kim et al.

(10) Patent No.: US 12,308,263 B2
(45) Date of Patent: May 20, 2025

(54) CHIP EJECTOR

(71) Applicant: SAMSUNG ELECTRONICS CO., LTD., Suwon-si (KR)

(72) Inventors: Hyeok Kim, Suwon-si (KR); Cheolan Kwon, Suwon-si (KR); Jongkeun Mok, Suwon-si (KR); Sangho Shin, Suwon-si (KR); Sodam Jung, Suwon-si (KR); Kiwook Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 18/200,068

(22) Filed: May 22, 2023

(65) Prior Publication Data

US 2024/0128097 A1    Apr. 18, 2024

(30) Foreign Application Priority Data

Oct. 13, 2022  (KR) .................. 10-2022-0131152

(51) Int. Cl.
*H01L 21/67* (2006.01)

(52) U.S. Cl.
CPC .............................. *H01L 21/67132* (2013.01)

(58) Field of Classification Search
CPC ........... H01L 21/67132; H01L 21/6838; H01L 21/6836; H01L 2221/6839
See application file for complete search history.

(56) References Cited

U.S. PATENT DOCUMENTS

| | | |
|---|---|---|
| 7,665,204 B2 | 2/2010 | Cheung et al. |
| 8,492,173 B2 | 7/2013 | Maki et al. |
| 9,111,984 B2 | 8/2015 | Sanchez et al. |
| 2007/0293022 A1* | 12/2007 | Ko .................... H01L 21/67132 438/464 |
| 2008/0092360 A1 | 4/2008 | Lee et al. |
| 2014/0238618 A1 | 8/2014 | Hwang et al. |

FOREIGN PATENT DOCUMENTS

| | | |
|---|---|---|
| KR | 10-2014-0107982 A | 9/2014 |
| KR | 10-1957959 B1 | 3/2019 |
| KR | 10-2120185 B1 | 6/2020 |

* cited by examiner

*Primary Examiner* — Michael A Tolin
*Assistant Examiner* — Christopher C Caillouet
(74) *Attorney, Agent, or Firm* — Muir Patent Law, PLLC

(57) ABSTRACT

A chip ejector may include an ejector body and a pushing mechanism, the ejector body may include first vacuum holes, an opening and at least one second vacuum hole, the first vacuum holes may fix a film having at least one semiconductor chip using a vacuum, the opening may be formed under the semiconductor chip, the second vacuum hole may be arranged around the opening to provide a portion of the film under an edge portion of a lower surface of the semiconductor chip with the vacuum, the pushing mechanism may be lifted in the ejector body through the opening to lift up the semiconductor chip and the film, thus, a sufficiently strong downward force may be applied to the portion of the film under the edge portion of the lower surface of the semiconductor chip to readily delaminate the semiconductor chip having a thin thickness from the film.

20 Claims, 12 Drawing Sheets

CHIP EJECTOR

CROSS-REFERENCE TO RELATED APPLICATION

This application claims priority under 35 USC § 119 to Korean Patent Application No. 10-2022-0131152, filed on Oct. 13, 2022 in the Korean Intellectual Property Office (KIPO), the contents of which are herein incorporated by reference in their entirety.

BACKGROUND

1. Field

Example embodiments relate to a chip ejector. More particularly, example embodiments relate to a chip ejector configured to delaminate a semiconductor chip from a film so as to mount the semiconductor chip on a package substrate.

2. Description of the Related Art

Generally, a mounting process of a semiconductor chip may include a delamination process, a pickup process, etc. The delamination process may delaminate a plurality of semiconductor chips from a film. A chip ejector may be used for the delamination process.

According to related arts, a semiconductor chip may have a very thin thickness. Thus, during a process of picking up a semiconductor chip from a film, there is a possibility that an edge portion of a lower surface of the semiconductor chip may not be readily delaminated from the film such that damage such as a crack may be generated in the semiconductor chip. Moreover, the pickup process of the semiconductor chip may not be performed accurately.

SUMMARY

According to example embodiments, there may be provided a chip ejector including an ejector body including a plurality of first vacuum holes, an opening in the ejector body and at least one second vacuum hole, the first vacuum holes being configured to fix a film having at least one semiconductor chip thereon using a vacuum, the opening being under the semiconductor chip, and the second vacuum hole being around the opening to provide the vacuum to a portion of the film under an edge portion of a lower surface of the semiconductor chip; and a pushing mechanism that can be lifted through the opening in the ejector body to lift up the semiconductor chip and the film According to example embodiments, there may be provided a chip ejector including a housing having an inner space configured to receive a vacuum for fixing a film with at least one semiconductor chip, a plate arranged on an upper surface of the housing, the plate including a plurality of first vacuum holes, an opening and at least one second vacuum hole, the first vacuum holes being configured to fix a film attached to at least one semiconductor chip using a vacuum, the opening being under the semiconductor chip, and the second vacuum hole being around the opening to provide the vacuum to a portion of the film under an edge portion of a lower surface of the semiconductor chip; and a pushing mechanism including a plurality of pushers, the pushers having an ability to be independently lifted in the housing through the opening to lift up the semiconductor chip and the film, wherein an outermost pusher among the pushers includes a plurality of concave portions and a plurality of convex portions alternately arranged on an upper surface of the outermost pusher, and the concave portions are connected to the second vacuum hole.

According to example embodiments there may be provided a chip ejector including a housing having an inner space configured to receive a vacuum for fixing a film with at least one semiconductor chip, a plate on an upper surface of the housing, the plate including a plurality of first vacuum holes, an opening and at least one second vacuum hole, the first vacuum holes being configured to fix a film having at least one semiconductor chip thereon using a vacuum, the opening being under the semiconductor chip, and the second vacuum hole being around the opening to provide the vacuum to a portion of the film under an edge portion of a lower surface of the semiconductor chip, a first pusher that is moveable upwardly through the opening to lift up the edge portion of the lower surface of the semiconductor chip, a second pusher arranged in the first pusher and having an ability to lift up a first middle portion of the lower surface of the semiconductor chip inside the edge portion of the lower surface of the semiconductor chip, a third pusher arranged in the second pusher and having an ability to lift up a second middle portion of the lower surface of the semiconductor chip inside the first middle portion of the lower surface of the semiconductor chip, a fourth pusher arranged in the third pusher and having an ability to lift up a central portion of the lower surface of the semiconductor chip inside the second middle portion of the lower surface of the semiconductor chip, and an actuator configured to independently lift the first pusher, the second pusher, the third pusher and the fourth pusher, wherein the second vacuum hole includes a plurality of side vacuum holes configured to provide the vacuum to portions of the film adjacent to a central portion of each of side surfaces of the semiconductor chip, a plurality of corner vacuum holes configured to provide the vacuum to portions of the film adjacent to corners of the semiconductor chip, and a plurality of vacuum lines extended from the corner vacuum holes toward the side vacuum holes, the first pusher includes a plurality of concave portions and a plurality of convex portions that are alternately arranged on an upper surface of the first pusher, and the concave portions are connected to the side vacuum holes, the corner vacuum holes and the vacuum lines

BRIEF DESCRIPTION OF THE DRAWINGS

Features will become apparent to those of skill in the art by describing in detail exemplary embodiments with reference to the attached drawings in which.

FIG. 1 is a perspective view illustrating a chip ejector in accordance with example embodiments;

FIG. 2 is a cross-sectional view illustrating the chip ejector in FIG. 1;

FIG. 3 is a plan view illustrating the chip ejector in FIG. 1;

FIG. 4 is a plan view illustrating a pushing mechanism of the chip ejector in FIG. 3;

FIG. 5 is an enlarged plan view of a portion "A" in FIG. 3;

FIGS. 6 to 9 are cross-sectional views illustrating an operation of the chip ejector in FIG. 2;

FIG. 10 is a plan view illustrating a chip ejector in accordance with example embodiments;

FIG. 11 is an enlarged plan view of a portion "B" in FIG. 10;

FIG. 12 is a plan view illustrating a chip ejector in accordance with example embodiments; and FIG. 13 is an enlarged plan view of a portion "C" in FIG. 12.

DETAILED DESCRIPTION

Hereinafter, example embodiments will be explained in detail with reference to the accompanying drawings.

Figure 1:
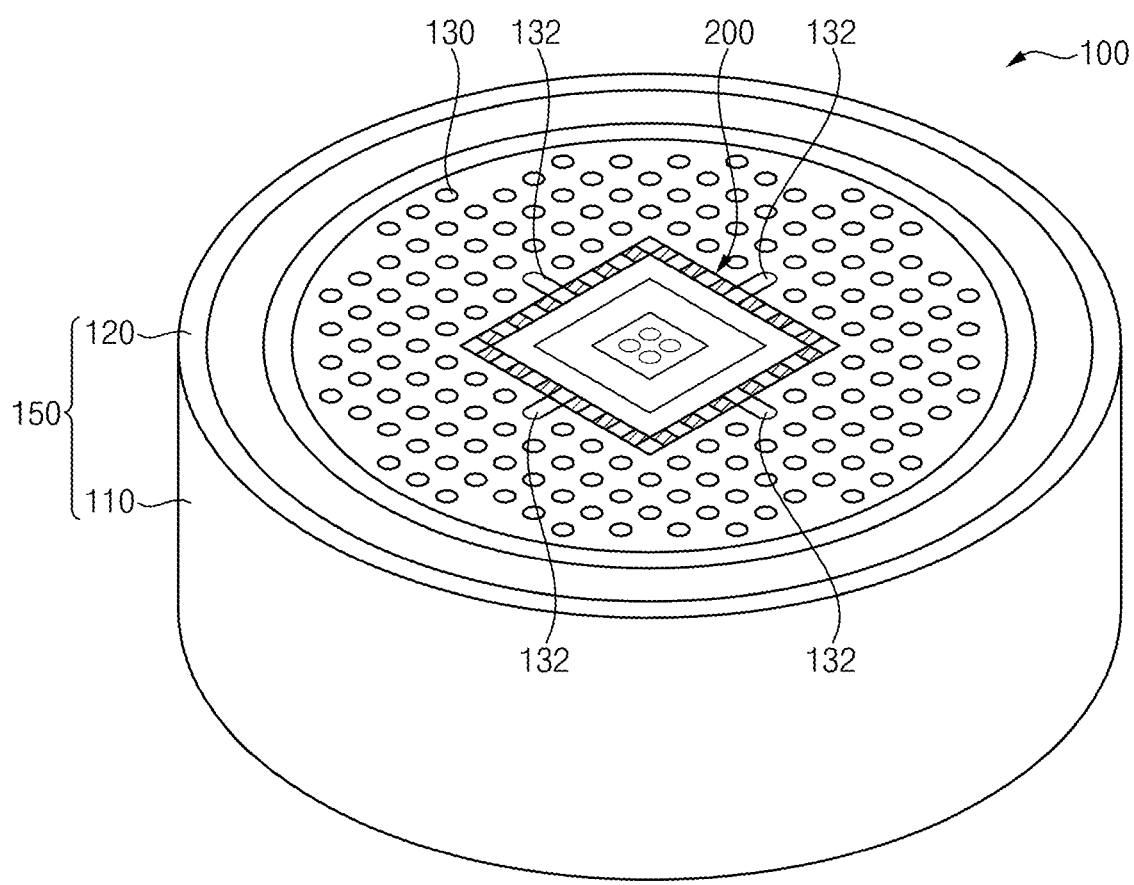
FIGS. 1 to 13 represent non-limiting, example embodiments as described herein.
Figure 2:
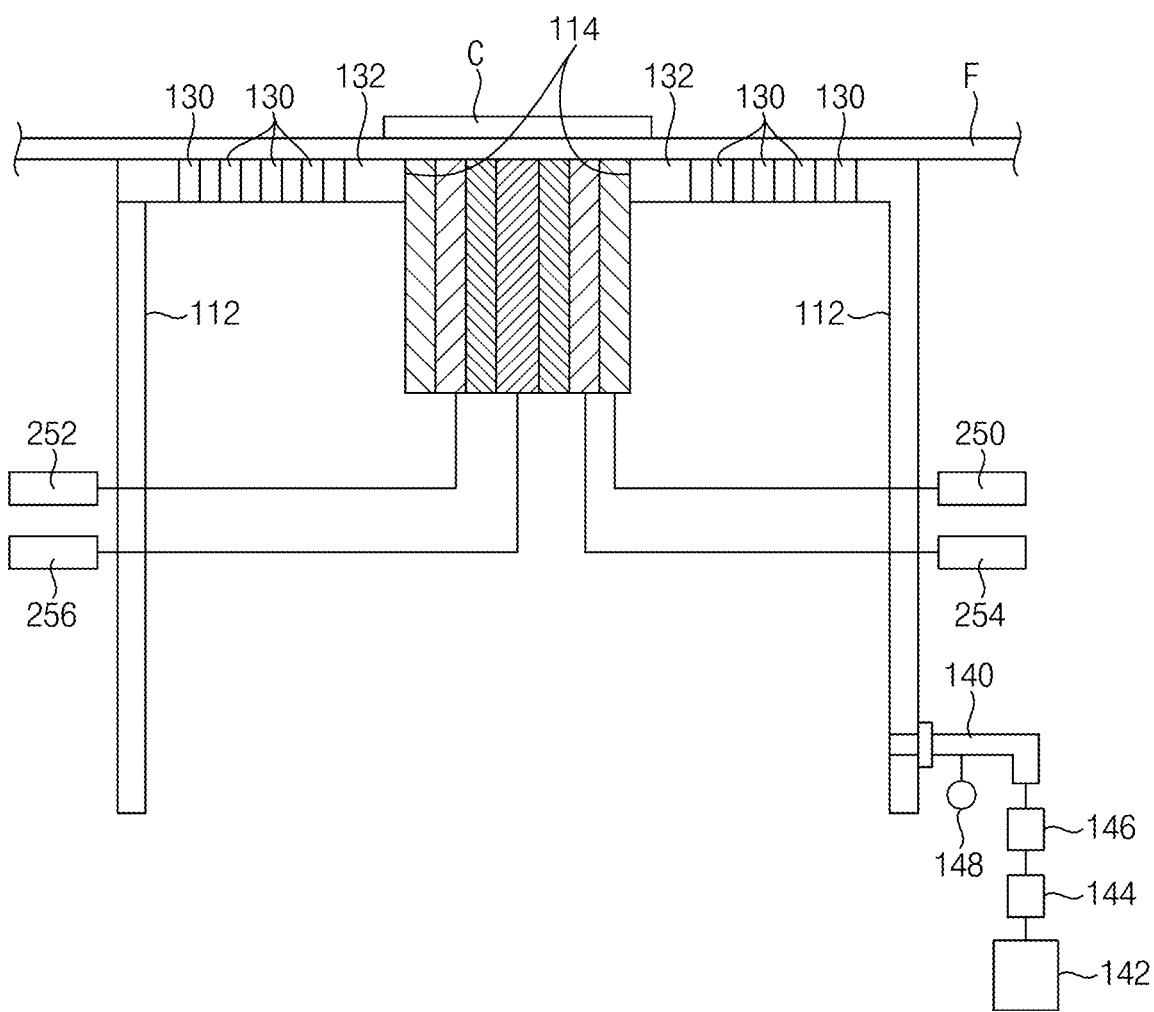
Figure 3:
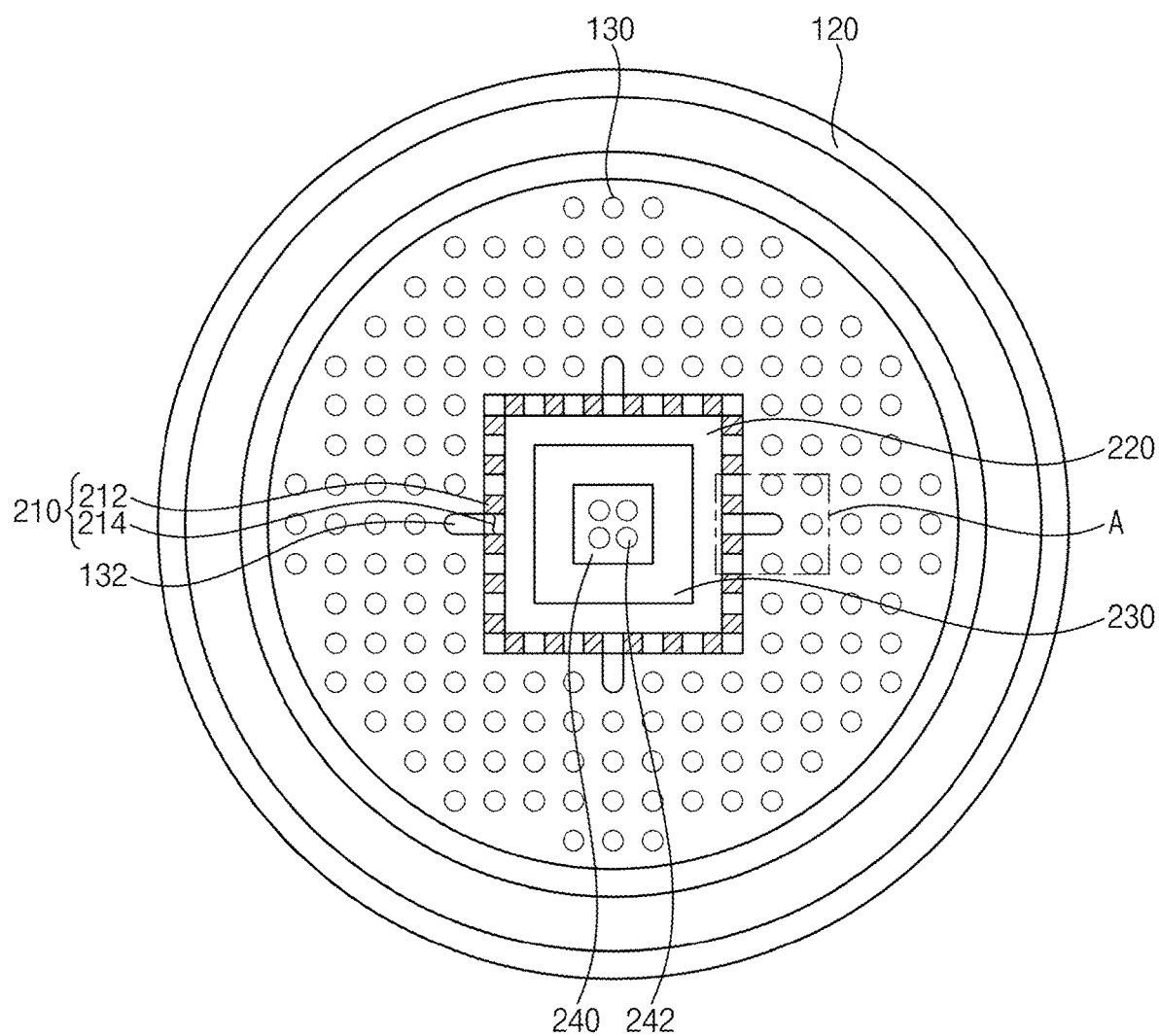
Figure 4:
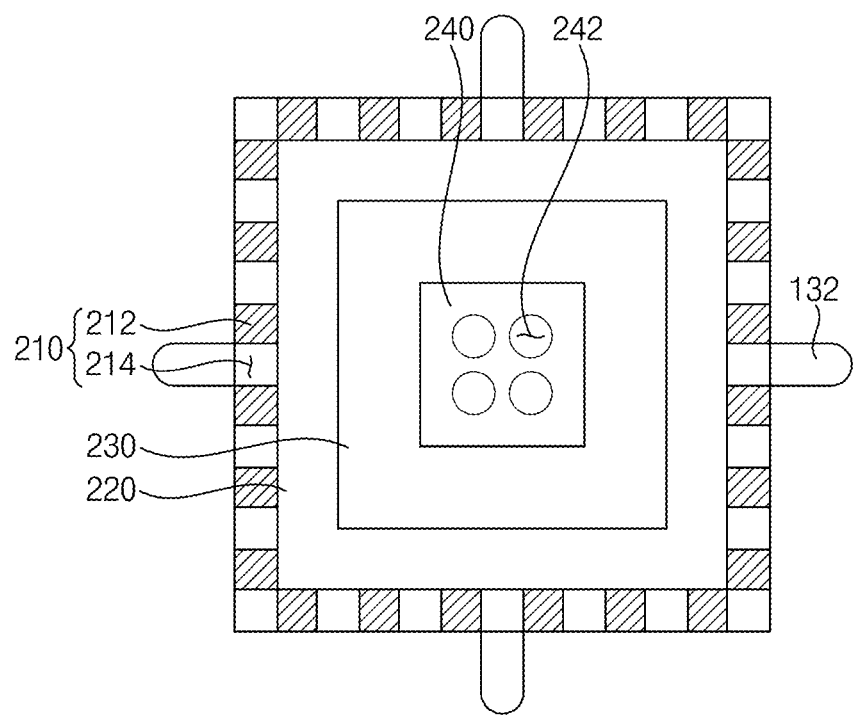
Figure 5:
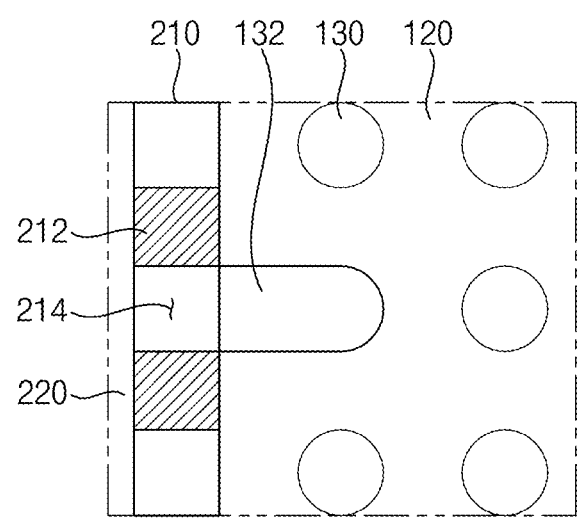

FIG. 1 is a perspective view illustrating a chip ejector in accordance with example embodiments, FIG. 2 is a cross-sectional view illustrating the chip ejector in FIG. 1, FIG. 3 is a plan view illustrating the chip ejector in FIG. 1, FIG. 4 is a plan view illustrating a pushing mechanism of the chip ejector in FIG. 3 and FIG. 5 is an enlarged plan view of a portion "A" in FIG. 3.

Referring to FIGS. 1 to 5, a chip ejector 100 according to example embodiments may be located under a film F to which at least one semiconductor chip C may be attached. The chip ejector 100 may delaminate the semiconductor chip C from the film F. Particularly, the chip ejector 10 may be capable of readily delaminating the semiconductor chip C, which has a thin thickness, from the film F. In more detail, the chip ejector 100 may delaminate the semiconductor chip C from the film F using a downward force that may be applied to the film F, and an upward force that may be applied to the semiconductor chip C, by use of a vacuum. The delaminated semiconductor chip C may be picked up by a pickup mechanism.

The chip ejector 100 of example embodiments may include an ejector body 150 and a pushing mechanism 200. The ejector body 150 may be arranged under the film F. The ejector body 150 may include a housing 110 and a plate 120.

The housing 110 may have a cylindrical shape, as an example. The housing 110 may have an opened upper surface. In some implementations, the housing 110 may have a closed lower surface. The housing 110 may have an inner space 112 configured to receive the vacuum.

A vacuum duct 140 may be connected to the housing 110. A vacuum pump 142 may be connected to the vacuum duct 140. A regulator 144, a valve 146 and a manometer 148 may be installed at the vacuum duct 140 to control the vacuum supplied to the inner space 112 from the vacuum pump 142 through the vacuum duct 140.

The plate 120 may be arranged on the upper surface of the housing 110. When the housing 110 has a cylindrical shape, the plate 120 may have a circular plate shape. Thus, the shape of the plate 120 may be selected in accordance with the shape of the housing 110. The film F may be placed on an upper surface of the plate 120.

The plate 120 may include an opening 114, a plurality of first vacuum holes 130 and at least one second vacuum hole.

The opening 114 may be formed through a central portion of the plate 120. The opening 114 may have a size configured to ably lift or receive the pushing mechanism 200 described below. The opening 114 may be positioned under the semiconductor chip C. The opening 114 may have a rectangular shape, as an example. Further, the opening 114 may have an area that is substantially the same as an area of the semiconductor chip C, as an example.

The first vacuum holes 130 may be vertically formed through the plate 120. The first vacuum holes 130 may be arranged to surround the opening 114. The first vacuum holes 130 may be spaced apart from each other by a uniform gap, as an example. For example, gaps between the first vacuum holes 130 may be different from each other. The first vacuum holes 130 may be connected to the inner space 112 of the housing 110. Further, each of the first vacuum holes 130 may have a circular shape, as examples. Thus, the vacuum introduced into the inner space 112 of the housing 110 may be provided to the film F through the first vacuum holes 130 to fix the film F to the upper surface of the plate 120 by the vacuum.

The second vacuum hole may be formed through a portion of the plate 120 around the opening 114. The second vacuum hole may be connected to the inner space 112 of the housing 110. Particularly, the second vacuum hole may provide the vacuum to a portion of the film F under an edge portion of a lower surface of the semiconductor chip C. Thus, the portion of the film F under the edge portion of the lower surface of the semiconductor chip C may be firmly fixed by the vacuum provided through the second vacuum hole.

In example embodiments, the second vacuum hole may include four side vacuum holes 132 positioned adjacent to central portions of four side surfaces of the opening 114. Each of the side vacuum holes 132 may be connected to the opening 114. The side vacuum holes 132 may provide the vacuum to the portion of the film F under a central portion of each of side surfaces of the semiconductor chip C. Each of the side vacuum holes 132 may have a long shape that extends toward the side surface of the opening 114, as an example. In example embodiments, each of the side vacuum holes 132 may be formed by extending the circular first vacuum hole 130 among the first vacuum holes 130 adjacent to the central portion of the side surface of the opening 114 toward the side surface of the opening 114. Thus, the vacuum introduced through the side vacuum holes 132 may be applied relatively closer to the edge portion of the lower surface of the semiconductor chip C rather than the vacuum introduced through the first vacuum hole 130 such that the portion of the film F under the edge portion of the lower surface of the semiconductor chip C may be firmly fixed. In some example embodiments, the side vacuum hole 132 may be a single hole arranged at one side surface of the opening 114. For example at least two side vacuum holes 132 may be arranged at one side surface of the opening 114.

The pushing mechanism 200 may be liftably arranged in the inner space 112 of the housing 110. The pushing mechanism 200 may be selectively lifted through the opening 114. The pushing mechanism 200 may be upwardly moved through the opening 114 to lift up the film F and the semiconductor chip C.

The pushing mechanism 200 may include a first pusher 210, a second pusher P 220, a third pusher 230, a fourth pusher 240 and an actuator. The first pusher 210, the second pusher 220, the third pusher 230 and the fourth pusher 240 may be independently lifted through the opening 114. The actuator may independently lift the first pusher 210, the second pusher 220, the third pusher 230 and the fourth pusher 240. Thus, the actuator may include a first actuator 250, a second actuator 252, a third actuator 254 and a fourth actuator 256. The first actuator 250 may be configured to independently lift the first pusher 210. The second actuator 252 may be configured to independently lift the second pusher 220. The third actuator 254 may be configured to independently lift the third pusher 230. The fourth actuator 256 may be configured to independently lift the fourth pusher 240. The actuator may include a motor, a cylinder, etc., as examples. In example embodiments, the pushing mechanism may include the four pushers. In some implementations, the pushing mechanism 200 may include two, three or at least five pushers.

The first pusher 210 may have a rectangular frame shape, as an example. The first pusher 210 may have a size corresponding to the size of the opening 114. Thus, outer side surfaces of the first pusher 210 may be adjacent inner side surfaces of the opening 114. The first pusher 210 may correspond to an outermost pusher of the pushing mechanism 200. The first pusher 210 may be connected to the first actuator 250. Thus, the first pusher 210 upwardly moved by the first actuator 250 may lift up the film F and the edge portion of the lower surface of the semiconductor chip C. In example embodiments, the first pusher 210 may be upwardly moveable by about ±10% of about 0.25 mm. That is, the first pusher 210 may be upwardly moveable by about 0.225 mm to about 0.275 mm.

The first pusher 210 may include a plurality of convex portions 212 and a plurality of concave portions 214. The convex portions 212 and the concave portions 214 may be formed on an upper surface of the first pusher 210. Further, the convex portions 212 and the concave portions 214 may be alternately arranged with each other. The concave portions 214 may be formed by partially removing the upper surface of the first pusher 210. Thus, the convex portions 212 may correspond to non-removed portions of the upper surface of the first pusher 210.

The concave portions 214 may be positioned under the convex portions 212. Thus, when the first actuator 250 moves the first pusher 210 upwardly, only the convex portions 212 may make contact with the film F. In contrast, the concave portions 214 may not make contact with the film F. Therefore, a contact area between the first pusher 210 and the film F may be reduced to readily delaminate the semiconductor chip C having the thin thickness from the film F.

Further, the concave portions 214 among the total concave portions 214 adjacent to the central portions of the side surfaces of the opening 114 may be connected to the side vacuum holes 132. Thus, the vacuum may be supplied to the concave portions 214 from the side vacuum holes 132. The vacuum over the concave portions 214 may be directly applied to the edge portion of the lower surface of the semiconductor chip C through the film F to more firmly fix the edge portion of the lower surface of the semiconductor chip C.

The second pusher 220 may be liftably arranged in the first pusher 210. The second pusher 220 may have a rectangular frame shape smaller than the rectangular frame-shaped first pusher 210. Thus, outer side surfaces of the second pusher 220 may be adjacent inner side surfaces of the first pusher 210. The second pusher 220 may be connected to the second actuator 252. Thus, the second pusher 220 may be upwardly moved by the second actuator 252 and may lift up a first middle portion of the lower surface of the semiconductor chip C inside the edge portion of the lower surface of the semiconductor chip C and a corresponding portion of the film F. In example embodiments, the second pusher 220 may be upwardly moved by about ±10% of about 0.15 mm. That is, the second pusher 220 may be upwardly moved by about 0.135 mm to about 0.165 mm.

The third pusher 230 may be liftably arranged in the second pusher 220. The third pusher 230 may have a rectangular frame shape smaller than the rectangular frame-shaped second pusher 220. Thus, outer side surfaces of the third pusher 230 may be adjacent inner side surfaces of the second pusher 220. The third pusher 230 may be connected to the third actuator 254. Thus, the third pusher 230 upwardly moved by the third actuator 254 may lift up a second middle portion of the lower surface of the semiconductor chip C inside the first middle portion of the lower surface of the semiconductor chip C and a corresponding portion of the film F. In example embodiments, the third pusher 230 may be upwardly moved by about ±10% of about 0.15 mm. That is, the third pusher 230 may be upwardly moved by about 0.135 mm to about 0.165 mm.

The fourth pusher 240 may be liftably arranged in the third pusher 230. The fourth pusher 240 may have a rectangular shape. Thus, outer side surfaces of the fourth pusher 240 may be adjacent inner side surfaces of the third pusher 230. The fourth pusher 240 may be connected to the fourth actuator 256. Thus, the fourth pusher 240 upwardly moved by the fourth actuator 256 may lift up a central portion of the lower surface of the semiconductor chip C inside the second middle portion of the lower surface of the semiconductor chip C and a corresponding portion of the film F. In example embodiments, the fourth pusher 240 may be upwardly moved by about ±10% of about 0.20 mm. That is, the fourth pusher 240 may be upwardly moved by about 0.18 mm to about 0.22 mm.

Further, the fourth pusher 240 may include a plurality of center vacuum holes 242. The center vacuum holes 242 may be connected to the inner space 112 of the housing 110. Thus, the vacuum introduced into the inner space 112 may be applied to the portion of the film F under the central portion of the lower surface of the semiconductor chip C through the center vacuum holes 242 to fix the film F to an upper surface of the fourth pusher 240.

In example embodiments, an ascent height of the first pusher 210 may be about 0.225 mm to about 0.275 mm. An ascent height of the second pusher 220 may be about 0.135 mm to about 0.165 mm. An ascent height of the third pusher 230 may be about 0.135 mm to about 0.165 mm. An ascent height of the fourth pusher 240 may be about 0.18 mm to about 0.22 mm. Thus, a total ascent height of the pushing mechanism 200 may be about 0.675 mm to about 0.825 mm. The total ascent height of the pushing mechanism 200 may be increased by an increasing of the ascent height of the first pusher 210. The ascent height of the first pusher 210 may be about 30% to about 35% of the total ascent height of the pushing mechanism 200, as an example.

Conventionally, the first to fourth pushers 210, 220, 230 and 240 may have substantially the same ascent height. That is, the ascent height of the first pusher 210 may be restricted to be within about 25% of the total ascent height of the pushing mechanism 200. This restriction may be caused by a weak vacuum provided to the edge portion of the lower surface of the semiconductor chip C. That is, a supporting force for fixing the portion of the film F under the edge portion of the lower surface of the semiconductor chip C may be weak. Thus, when the ascent height of the first pusher 210 is set to be above 25% of the total ascent height of the pushing mechanism 200, although a force for upwardly lifting the edge portion of the lower surface of the semiconductor chip C may be strengthened, an upward force by the first pusher 210 may be relatively stronger than a downward force for downwardly drawing the film F. As a result, a difference between the downward force and the upward force may be a cause of low delamination efficiency of the semiconductor chip C from the film F.

In contrast, according to example embodiments, the vacuum provided to the second vacuum hole and the concave portions 214 may firmly fix the portion of the film F under the edge portion of the lower surface of the semiconductor chip C. Thus, when the ascent height of the first pusher 210 is about 30% to about 35% of the total ascent height of the pushing mechanism 200, the downward force corresponding to the upward force may be applied to the portion of the film F. Further, the vacuum provided through the center vacuum hole 242 may firmly fix the portion of the film F under the central portion of the lower surface of the semiconductor chip C such that the ascent height of the fourth pusher 240 may also be increased. Therefore, during the application of the vacuum, the semiconductor chip C may be finally delaminated from the film F. For example, the semiconductor chip C may be readily delaminated from the film F due to the increased upward force along with holding the film F by the sufficiently strong downward force. As a result, the delamination efficiency of the semiconductor chip C from the film F may be improved.

FIGS. 6 to 9 are cross-sectional views illustrating an operation of the chip ejector shown in FIG. 2.

Figure 6:
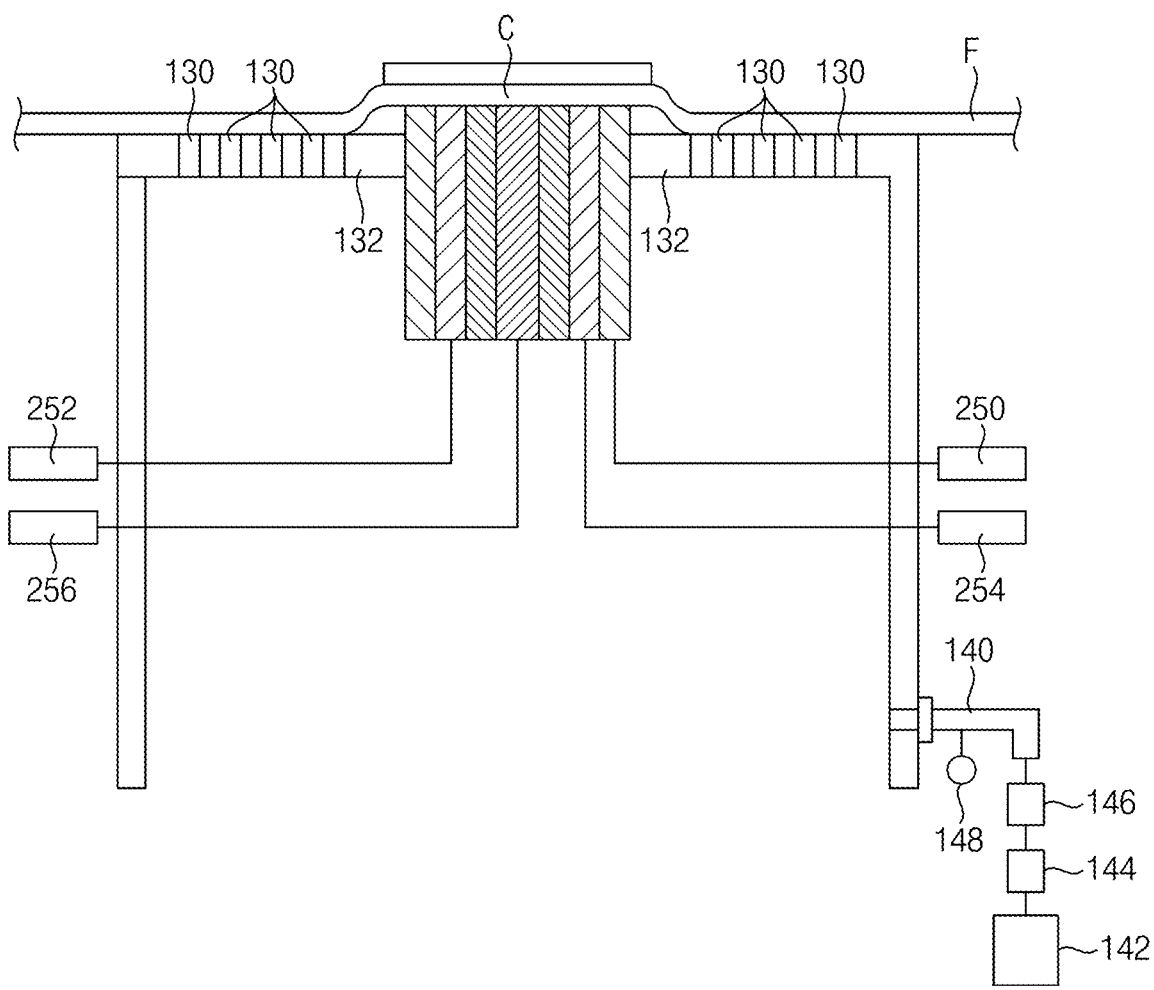

Referring to FIG. 6, the film F with the semiconductor chip C may be placed on the upper surface of the plate 120. The vacuum generated from the vacuum pump 142 may be applied to the film F through the first vacuum holes 130 to fix the film F to the upper surface of the plate 120.

The vacuum may also be applied to the portion of the film F under the edge portion of the lower surface of the semiconductor chip C to firmly fix the portion of the film F under the edge portion of the lower surface of the semiconductor chip C. That is, a sufficiently strong downward force may be applied to the portion of the film F under the edge portion of the lower surface of the semiconductor chip C. The vacuum may also be applied to the portion of the film F under the central portion of the lower surface of the semiconductor chip C through the center vacuum holes 242.

The first to fourth actuators 250, 252, 254 and 256 may move the first to fourth pushers 210, 220, 230 and 240 upwardly by about 0.25 mm. Thus, the first to fourth pushers 210, 220, 230 and 240 may lift up the semiconductor chip C and the film F under the semiconductor chip C. In particular, the first pusher 210 may lift up the edge portion of the lower surface of the semiconductor chip C. The second pusher 220 may lift up the first middle portion of the lower surface of the semiconductor chip C. The third pusher 230 may lift up the second middle portion of the lower surface of the semiconductor chip C. The fourth pusher 240 may lift up the central portion of the lower surface of the semiconductor chip C.

As mentioned above, the vacuum supplied to the side vacuum holes 132 and the concave portions 214 may firmly fix the portion of the film F under the edge portion of the lower surface of the semiconductor chip C. Accordingly, the first pusher 210 may be upwardly moved by about 30% to about 35% of the total ascent height of the pushing mechanism 200 to apply a sufficiently strong upward force to the edge portion of the lower surface of the semiconductor chip C.

Figure 7:
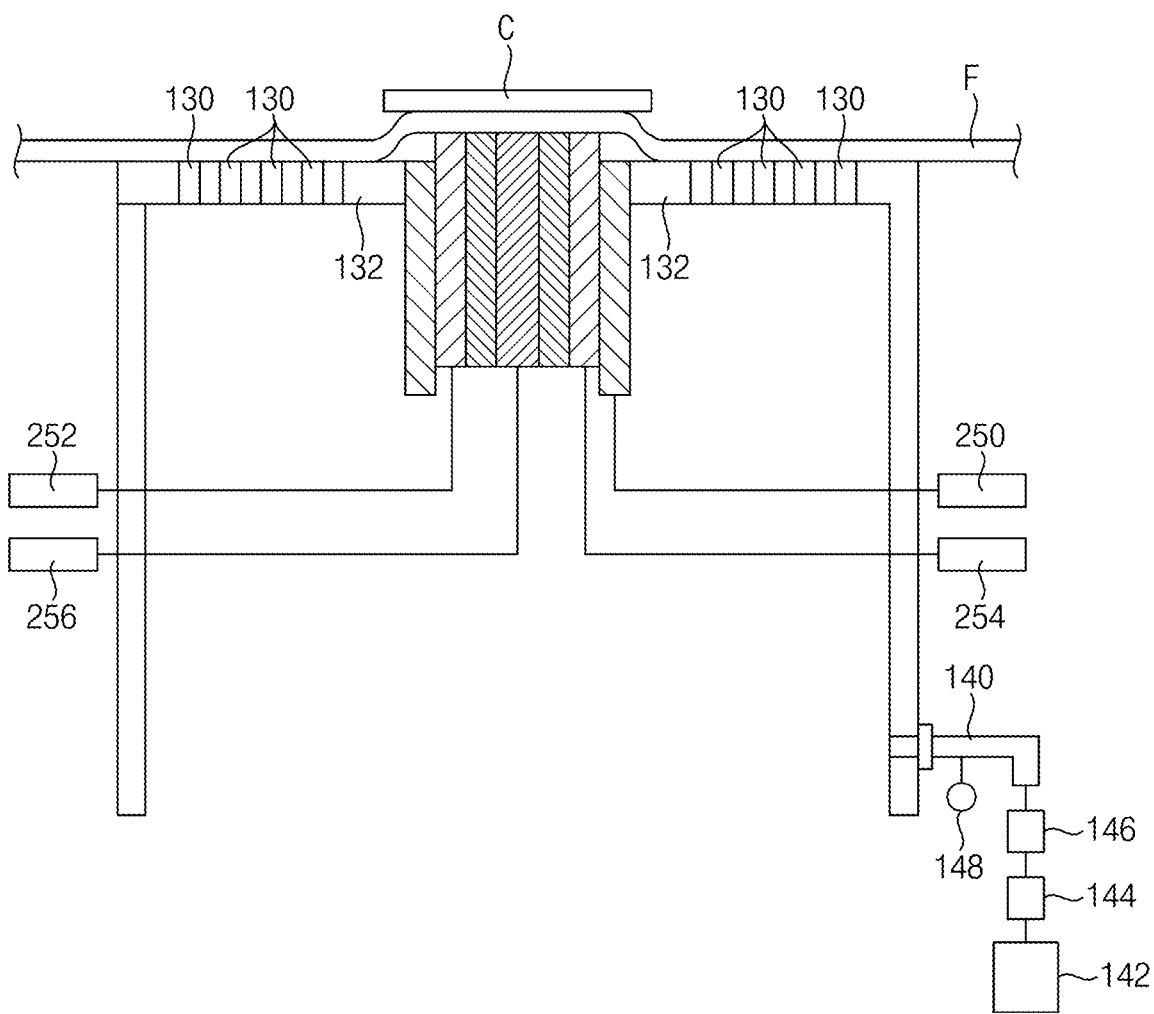

Referring to FIG. 7, the second to fourth actuators 252, 254 and 256 may upwardly move the second to fourth pushers 220, 230 and 240 by about 0.15 mm. Thus, the second to fourth pushers 220, 230 and 240 may lift up the first middle portion, the second middle portion and the central portion of the lower surface of the semiconductor chip C and the film F under the portions of the semiconductor chip C. In particular, the second pusher 220 may lift up the first middle portion of the lower surface of the semiconductor chip C. The third pusher 230 may lift up the second middle portion of the lower surface of the semiconductor chip C. The fourth pusher 240 may lift up the central portion of the lower surface of the semiconductor chip C.

Figure 8:
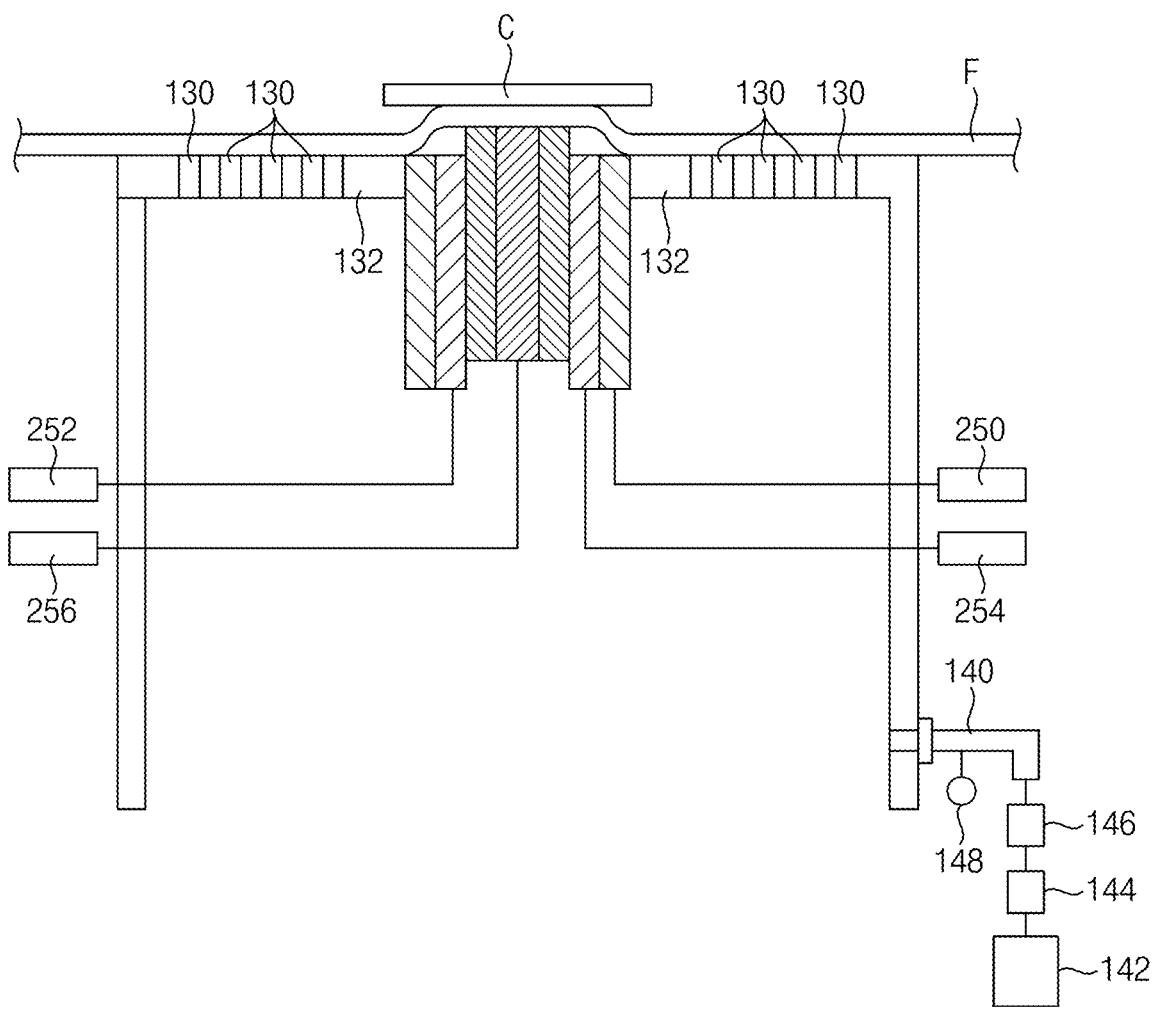

Referring to FIG. 8, the third and fourth actuators 254 and 256 may upwardly move the third and fourth pushers 230 and 240 by about 0.15 mm. Thus, the third and fourth pushers 230 and 240 may lift up the second middle portion and the central portion of the lower surface of the semiconductor chip C and the film F under the portions of the semiconductor chip C. In particular, the third pusher 230 may lift up the second middle portion of the lower surface of the semiconductor chip C. The fourth pusher 240 may lift up the central portion of the lower surface of the semiconductor chip C.

Figure 9:
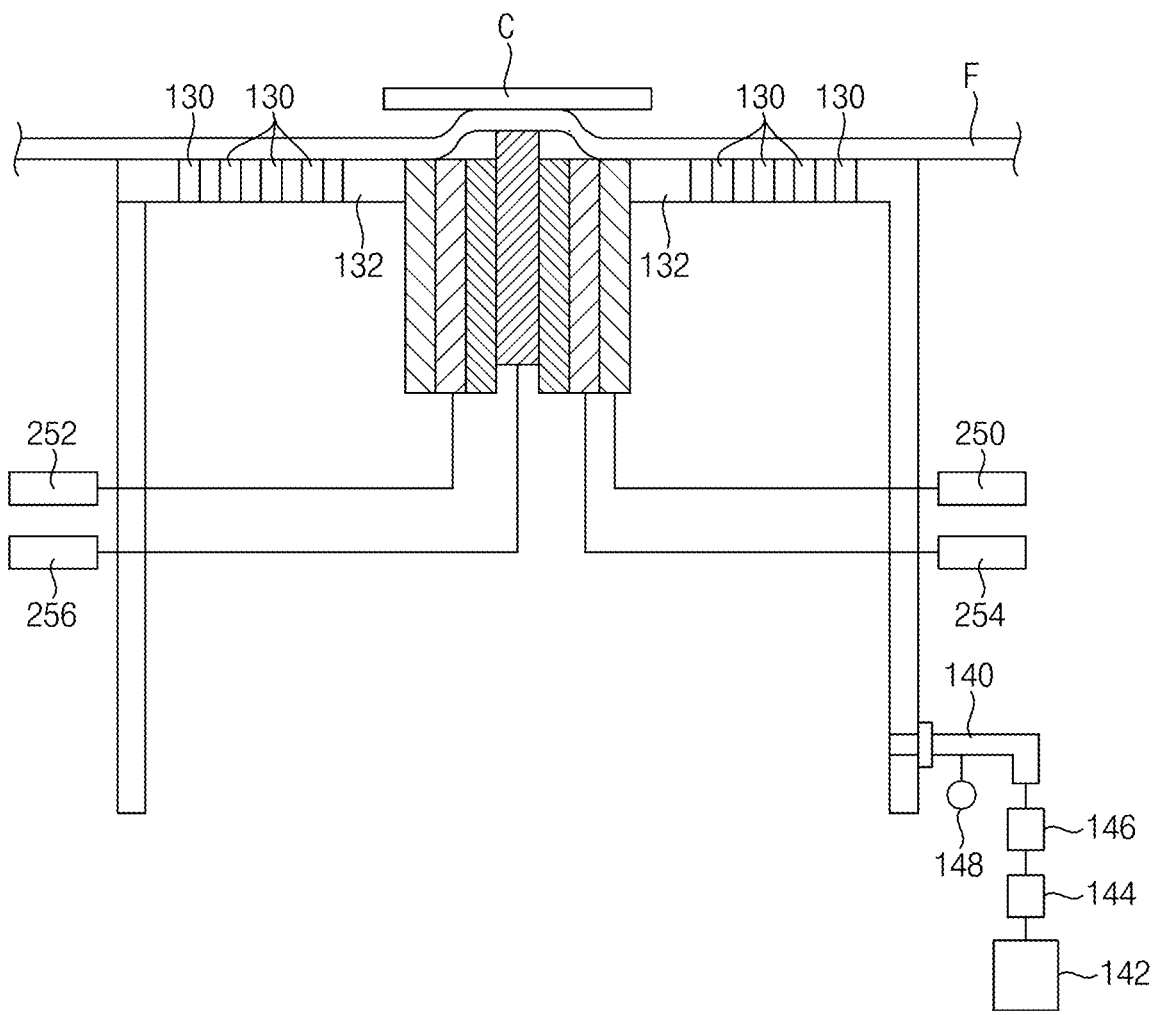

Referring to FIG. 9, the fourth actuator 256 may upwardly move the fourth pusher 240 by about 0.20 mm. Thus, the fourth pusher 240 may lift up the central portion of the lower surface of the semiconductor chip C and the film F under the portion of the semiconductor chip C.

The pickup mechanism may pick up the semiconductor chip C to delaminate the semiconductor chip C from the film F.

Figure 10:
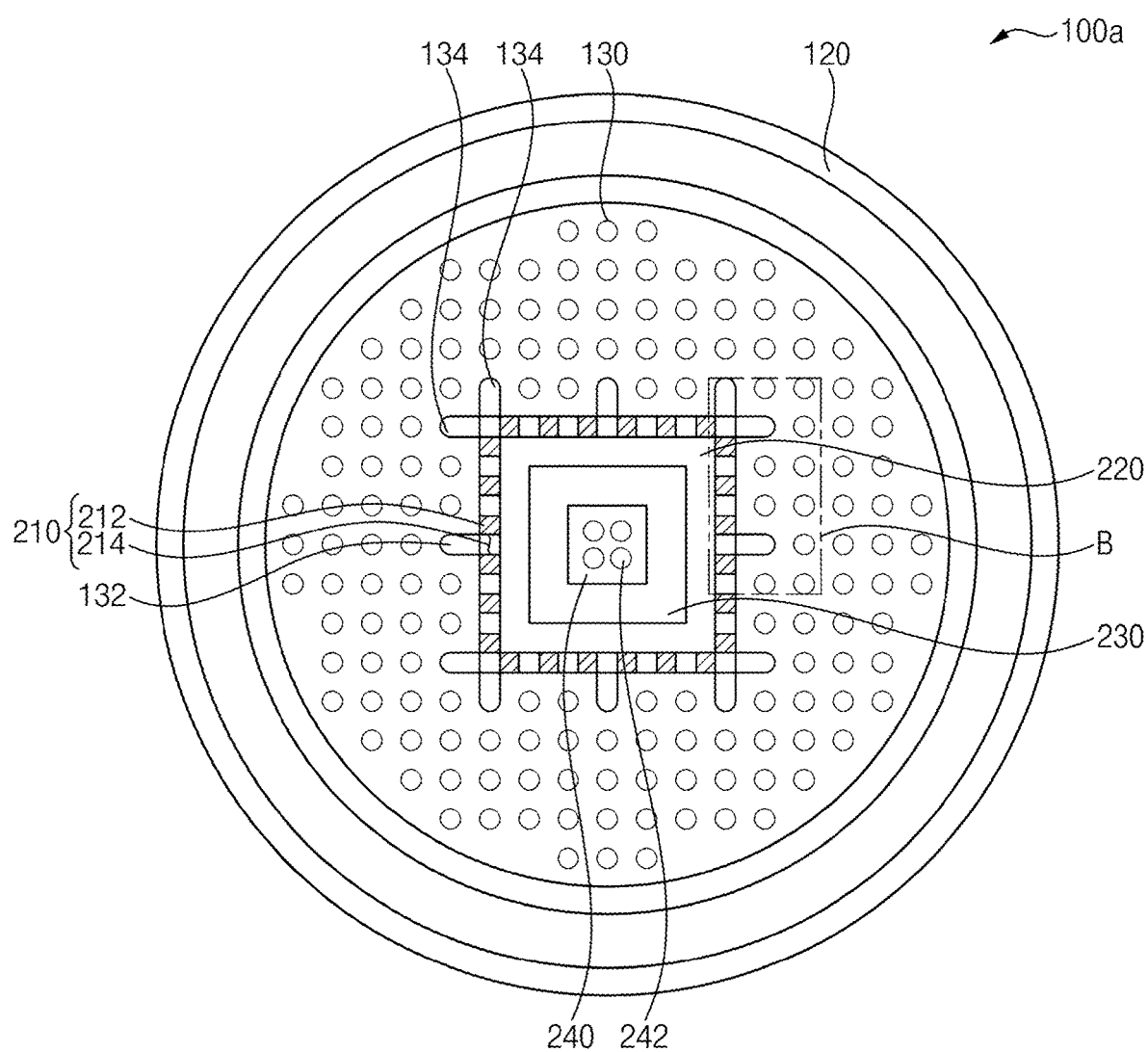
Figure 11:
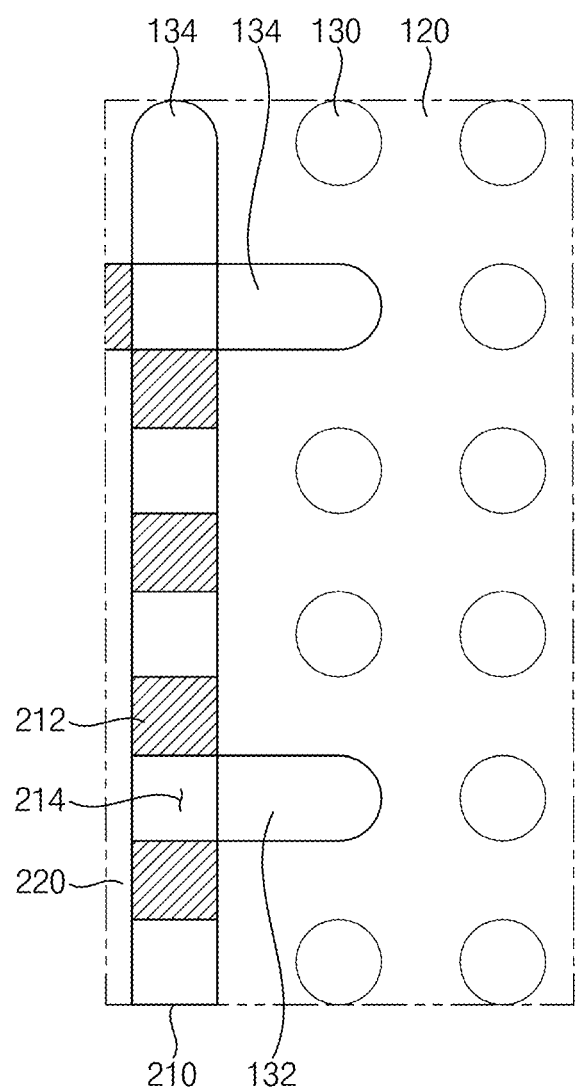

FIG. 10 is a plan view illustrating a chip ejector in accordance with example embodiments, and FIG. 11 is an enlarged plan view of a portion "B" in FIG. 10.

A chip ejector 100a of example embodiments may include elements substantially the same as those of the chip ejector 100 in FIG. 3 except for a second vacuum hole. Thus, the same reference numerals may refer to the same elements and any further illustrations with respect to the same elements may be omitted herein for brevity.

Referring to FIGS. 10 and 11, a second vacuum hole may further include a plurality of corner vacuum holes 134 adjacent to corners of the opening 114. Each of the corner vacuum holes 134 may be connected to the opening 114. Each of the corner vacuum holes 134 may be formed by extending the circular first vacuum hole 130 among the first vacuum holes 130 adjacent to the corner of the opening 114 toward the corner of the opening 114. In example embodiments, the corner vacuum holes 134 may be made up of two holes arranged at the corners of the opening 114, as examples. For example, the corner vacuum hole 134 may be one hole or may be at least three holes arranged at the corners of the opening 114.

Therefore, the vacuum introduced through the corner vacuum holes 134 may be applied to portions of the film F under corners of the semiconductor chip C to firmly fix the portions of the film F under the corners of the lower surface of the semiconductor chip C.

In some implementations, the second vacuum hole may include only the corner vacuum holes 134, and not include the side vacuum holes 132.

Figure 12:
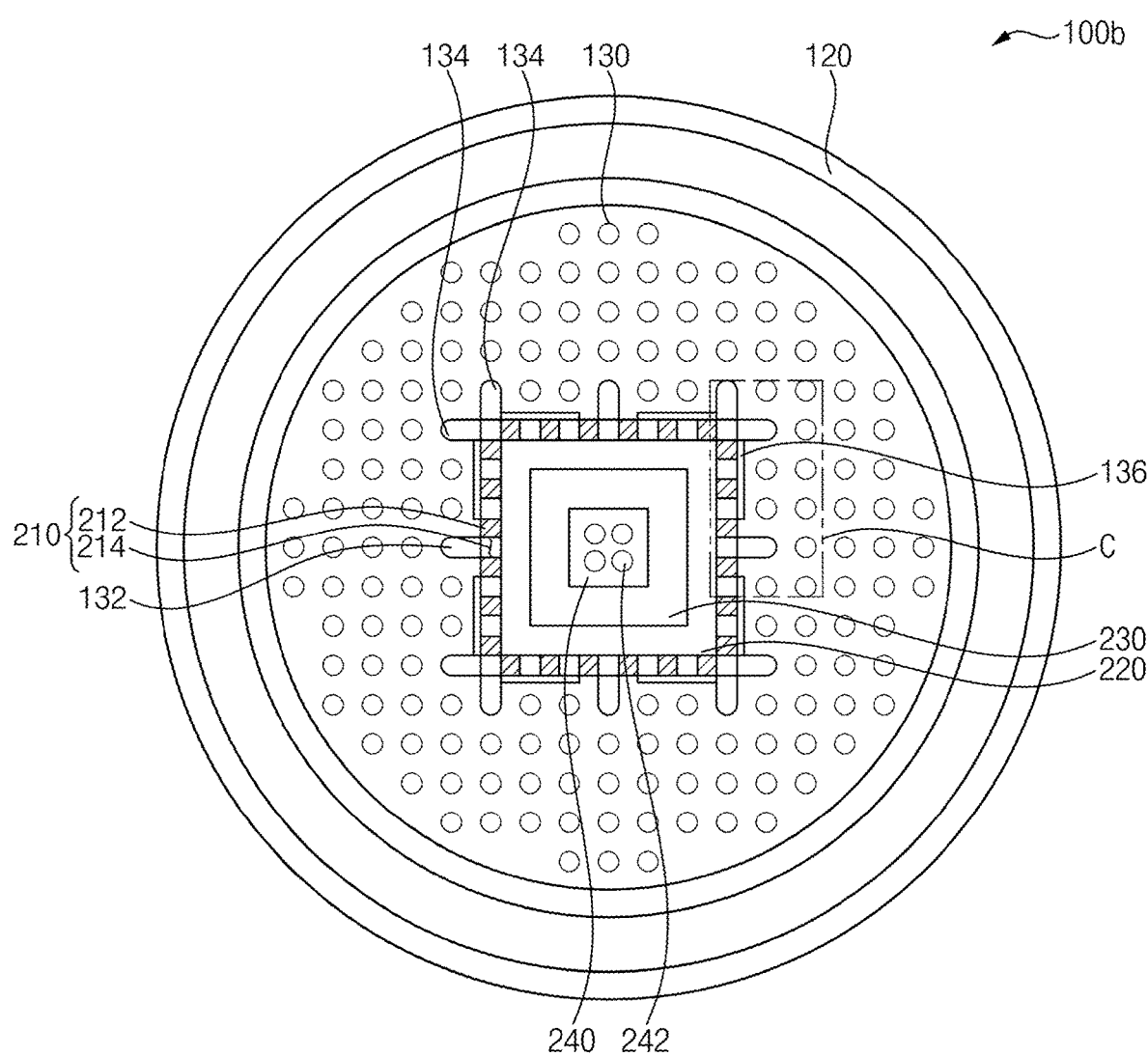
Figure 13:
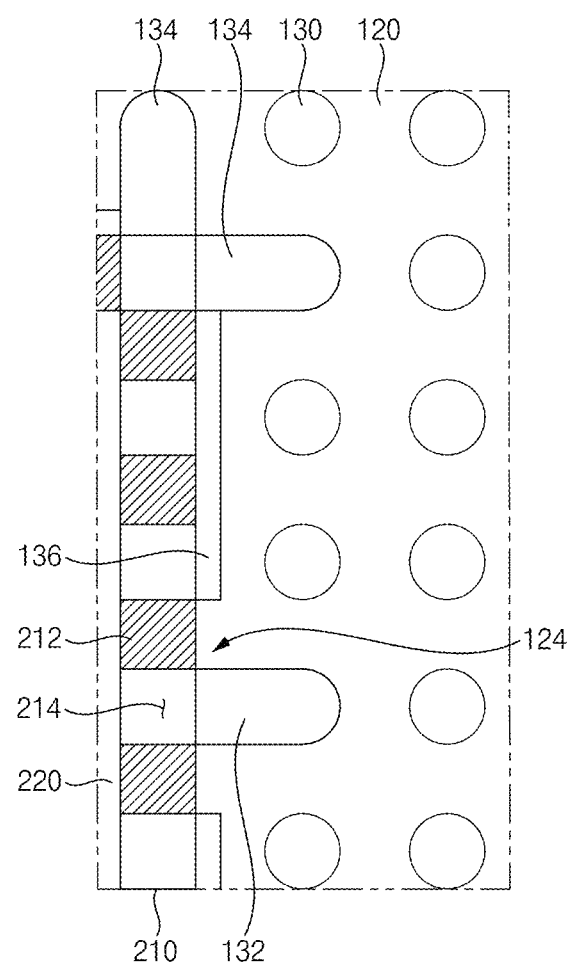

FIG. 12 is a plan view illustrating a chip ejector in accordance with example embodiments. FIG. 13 is an enlarged plan view of a portion "C" in FIG. 12.

A chip ejector 100b of example embodiments may include elements substantially the same as those of the chip ejector 100a in FIG. 10 except for a second vacuum hole. Thus, the same reference numerals may refer to the same elements and any further illustrations with respect to the same elements may be omitted herein for brevity.

Referring to FIGS. 12 and 13, a second vacuum hole may further include a plurality of vacuum lines 136. Each of the vacuum lines 136 may extend from each of the corner vacuum holes 134 toward each of the side vacuum holes 132. Each of the vacuum lines 136 may be connected to the side vacuum hole 132. In some implementations, each of the vacuum lines 136 may not be connected to the side vacuum hole 132.

Therefore, the vacuum introduced through the corner vacuum holes 134 may be applied to portions of the film F under the side surfaces of the semiconductor chip C through the vacuum lines 136 to firmly fix the portions of the film F under the side surfaces of the lower surface of the semiconductor chip C.

When the vacuum line 136 is connected to the side vacuum hole 132, a gap between the opening 114 and the pushing mechanism 200 may be wide due to the effects of the vacuum line 136. For example, the gap between the inner surface of the opening 114 and the outer surface of the first pusher 210 may be wide. When the gap between the opening 114 and the pushing mechanism 200 is wide, there is a possibility that a vibration could be generated by the pushing mechanism 200 during the lift movement of the pushing mechanism 200 through the opening 114.

In order to prevent the generation of vibration of the pushing mechanism 200, the plate 120 may further include a plurality of gap-maintaining portions 124. The gap-maintaining portions 124 may be parts of the plate 120 between the vacuum line 136 and the side vacuum hole 132. The gap-maintaining portions 124 may maintain a designed gap between the opening 114 and the pushing mechanism 200 to prevent the vibration of the pushing mechanism 200 during the lift movement of the pushing mechanism 200 through the opening 114.

According to example embodiments, the second vacuum hole may be formed around the opening to apply the vacuum to the portion of the film under the edge portion of the lower surface of the semiconductor chip through the second vacuum hole. Thus, a sufficiently strong downward force may be applied to the portion of the film under the edge portion of the lower surface of the semiconductor chip. Further, the vacuum may be supplied to the concave portions of the first pusher through the second vacuum hole to firmly fix the portion of the film under the edge portion of the lower surface of the semiconductor chip. Furthermore, only the convex portions of the first pusher may make contact with the portion of the film under the semiconductor chip, thereby reducing a contact area between the first pusher and the film. As a result, the semiconductor chip having a thin thickness may be readily delaminated from the film.

By way of summation and review, Example embodiments provide a chip ejector configured to delaminate a semiconductor chip from a film so as to mount the semiconductor chip on a package substrate. Example embodiments further provide a chip ejector capable of readily delaminating a semiconductor chip having a thin thickness from a film. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chip ejector comprising:
   an ejector body including a plurality of first vacuum holes, an opening in the ejector body and at least one second vacuum hole extending from a side surface of the opening, the first vacuum holes being configured to fix a film having at least one semiconductor chip thereon using a vacuum, the opening being under the semiconductor chip, and the second vacuum hole being around the opening to provide the vacuum to a portion of the film under an edge portion of a lower surface of the semiconductor chip; and
   a pushing mechanism configured to be lifted through the opening in the ejector body to lift up the semiconductor chip and the film.

2. The chip ejector as claimed in claim 1, wherein the ejector body includes:
   a housing having an inner space configured to receive the vacuum and the pushing mechanism; and
   a plate arranged on an upper surface of the housing, the plate including the first vacuum holes, the opening and the at least one second vacuum hole.

3. The chip ejector as claimed in claim 2, wherein the at least one second vacuum hole includes a plurality of side vacuum holes configured to provide the vacuum to portions of the film adjacent to a central portion of each of side surfaces of the semiconductor chip.

4. The chip ejector as claimed in claim 3, wherein the at least one second vacuum hole further includes a plurality of corner vacuum holes configured to provide the vacuum to portions of the film adjacent to corners of the semiconductor chip.

5. The chip ejector as claimed in claim 4, wherein the second vacuum hole further includes a plurality of vacuum lines that extend from the corner vacuum holes toward the side vacuum holes.

6. The chip ejector as claimed in claim 5, wherein the plate further includes a plurality of gap-maintaining portions positioned between the vacuum lines and the side vacuum holes to maintain a gap between the opening in the ejector body and the pushing mechanism.

7. The chip ejector as claimed in claim 1, wherein the pushing mechanism includes:
   a first pusher that is upwardly movable through the opening in the ejector body to lift up the edge portion of the lower surface of the semiconductor chip;
   a second pusher arranged in the first pusher such that the second pusher has an ability to lift up a first middle portion of the lower surface of the semiconductor chip inside the edge portion of the lower surface of the semiconductor chip;
   a third pusher arranged in the second pusher such that the third pusher has an ability to lift up a second middle portion of the lower surface of the semiconductor chip inside the first middle portion of the lower surface of the semiconductor chip;
   a fourth pusher arranged in the third pusher such that the fourth pusher has an ability to lift up a central portion of the lower surface of the semiconductor chip inside the second middle portion of the lower surface of the semiconductor chip; and
   an actuator configured to independently lift the first pusher, the second pusher, the third pusher and the fourth pusher.

8. The chip ejector as claimed in claim 7, wherein the first pusher includes a plurality of concave portions and a plurality of convex portions that are alternately arranged on an upper surface of the first pusher.

9. The chip ejector as claimed in claim 8, wherein the concave portions are connected to the second vacuum hole.

10. The chip ejector as claimed in claim 7, wherein the fourth pusher includes at least one center vacuum hole.

11. The chip ejector as claimed in claim 7, wherein the first pusher has an ascent height of about 30% to about 35% of a total ascent height of the pushing mechanism.

12. A chip ejector comprising:
a housing having an inner space configured to receive a vacuum for fixing a film with at least one semiconductor chip;
a plate arranged on an upper surface of the housing, the plate including a plurality of first vacuum holes, an opening and at least one second vacuum hole, the first vacuum holes being configured to fix a film attached to at least one semiconductor chip using a vacuum, the opening being under the semiconductor chip, and the second vacuum hole being around the opening to provide the vacuum to a portion of the film under an edge portion of a lower surface of the semiconductor chip; and
a pushing mechanism including a plurality of pushers, the plurality of pushers having an ability to be independently lifted in the housing through the opening to lift up the semiconductor chip and the film,
wherein an outermost pusher among the plurality of pushers includes a plurality of concave portions and a plurality of convex portions alternately arranged on an upper surface of the outermost pusher, and
wherein the concave portions are connected to the second vacuum hole.

13. The chip ejector as claimed in claim 12, wherein the second vacuum hole includes:
a plurality of side vacuum holes configured to provide the vacuum to portions of the film adjacent to a central portion of each of side surfaces of the semiconductor chip;
a plurality of corner vacuum holes configured to provide the vacuum to portions of the film adjacent to corners of the semiconductor chip; and
a plurality of vacuum lines that extend from the corner vacuum holes toward the side vacuum holes.

14. The chip ejector as claimed in claim 13, wherein the plate further includes a plurality of gap-maintaining portions positioned between the vacuum lines and the side vacuum holes to maintain a gap between the opening and the outermost pusher.

15. The chip ejector as claimed in claim 12, wherein the pushing mechanism includes:
a first pusher that is upwardly movable through the opening to lift up the edge portion of the lower surface of the semiconductor chip, the first pusher including the concave portions and the convex portions;
a second pusher arranged in the first pusher and having an ability to lift up a first middle portion of the lower surface of the semiconductor chip inside the edge portion of the lower surface of the semiconductor chip;
a third pusher arranged in the second pusher and having an ability to lift up a second middle portion of the lower surface of the semiconductor chip inside the first middle portion of the lower surface of the semiconductor chip;
a fourth pusher arranged in the third pusher and having an ability to lift up a central portion of the lower surface of the semiconductor chip inside the second middle portion of the lower surface of the semiconductor chip; and
an actuator configured to independently lift the first pusher, the second pusher, the third pusher and the fourth pusher.

16. The chip ejector as claimed in claim 15, wherein the fourth pusher includes at least one center vacuum hole.

17. The chip ejector as claimed in claim 15, wherein the first pusher has an ascent height of about 30% to about 35% of a total ascent height of the pushing mechanism.

18. A chip ejector comprising:
a housing having an inner space configured to receive a vacuum for fixing a film with at least one semiconductor chip;
a plate on an upper surface of the housing, the plate including a plurality of first vacuum holes, an opening and at least one second vacuum hole, the first vacuum holes being configured to fix a film having at least one semiconductor chip thereon using a vacuum, the opening being under the semiconductor chip, and the second vacuum hole being around the opening to provide the vacuum to a portion of the film under an edge portion of a lower surface of the semiconductor chip;
a first pusher that is moveable upwardly through the opening to lift up the edge portion of the lower surface of the semiconductor chip;
a second pusher arranged in the first pusher and having an ability to lift up a first middle portion of the lower surface of the semiconductor chip inside the edge portion of the lower surface of the semiconductor chip;
a third pusher arranged in the second pusher and having an ability to lift up a second middle portion of the lower surface of the semiconductor chip inside the first middle portion of the lower surface of the semiconductor chip;
a fourth pusher arranged in the third pusher and having an ability to lift up a central portion of the lower surface of the semiconductor chip inside the second middle portion of the lower surface of the semiconductor chip; and
an actuator configured to independently lift the first pusher, the second pusher, the third pusher and the fourth pusher,
wherein the second vacuum hole includes:
a plurality of side vacuum holes configured to provide the vacuum to portions of the film adjacent to a central portion of each of side surfaces of the semiconductor chip;
a plurality of corner vacuum holes configured to provide the vacuum to portions of the film adjacent to corners of the semiconductor chip; and
a plurality of vacuum lines extended from the corner vacuum holes toward the side vacuum holes,
wherein the first pusher comprises a plurality of concave portions and a plurality of convex portions that are alternately arranged on an upper surface of the first pusher, and
wherein the concave portions are connected to the side vacuum holes, the corner vacuum holes and the vacuum lines.

19. The chip ejector as claimed in claim 18, wherein the plate further includes a plurality of gap-maintaining portions positioned between the vacuum lines and the side vacuum holes to maintain a gap between the opening and the first pusher.

20. The chip ejector as claimed in claim 18, wherein the fourth pusher includes at least one center vacuum hole.

* * * * *